(12) United States Patent
Linkov et al.

(10) Patent No.: US 9,459,383 B2
(45) Date of Patent: Oct. 4, 2016

(54) OPTOELECTRONIC DEVICE

(71) Applicant: OSRAM Opto Semiconductors GmbH, Regensburg (DE)

(72) Inventors: Alexander Linkov, Regensburg (DE); Matthias Sabathil, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/430,202

(22) PCT Filed: Sep. 13, 2013

(86) PCT No.: PCT/EP2013/069040
§ 371 (c)(1),
(2) Date: Mar. 20, 2015

(87) PCT Pub. No.: WO2014/048773
PCT Pub. Date: Apr. 3, 2014

(65) Prior Publication Data
US 2015/0346397 A1 Dec. 3, 2015

(30) Foreign Application Priority Data
Sep. 27, 2012 (DE) .................. 10 2012 217 643

(51) Int. Cl.
*H01L 33/50* (2010.01)
*G02B 5/02* (2006.01)
(Continued)

(52) U.S. Cl.
CPC ........... *G02B 5/0278* (2013.01); *G02B 5/0242* (2013.01); *G02B 5/0247* (2013.01);
(Continued)

(58) Field of Classification Search
CPC ... H01L 33/50; H01L 33/504; H01L 33/505; H01L 33/508; H01L 33/56
See application file for complete search history.

(56) References Cited

U.S. PATENT DOCUMENTS 6,791,259 B1 * 9/2004 Stokes ............... C09K 11/7734
257/98
2009/0243457 A1 10/2009 Jung et al.
(Continued)

FOREIGN PATENT DOCUMENTS

DE 102005013785 A1 11/2005
DE 102005044396 A1 4/2006
(Continued)

OTHER PUBLICATIONS

GE Silicones, Material Safety Data Sheet, issued by GE Silicones Australia Pty LTd, Jun. 2005.*

*Primary Examiner* — Yu Chen
(74) *Attorney, Agent, or Firm* — McDermott Will & Emery LLP

(57) ABSTRACT

The invention relates to an optoelectronic device (101), comprising: a semiconductor layer sequence (103) comprising an emitter layer (105) for emitting electromagnetic radiation, a converter (113) for converting electromagnetic radiation with a first wavelength into an electromagnetic radiation with a second wavelength which differs from the first wavelength, a scattering body (109) for scattering at least a part of the electromagnetic radiation emitted by the emitter layer (105) in the direction of the converter (113) in order to convert at least a part of the emitted electromagnetic radiation, wherein the scattering body (109) comprises a positive, temperature-dependent scattering cross-section and so, as the temperature increases, scattering of the electromagnetic radiation in the scattering body (109) in the direction of the converter can be increased. The invention also relates to a scattering body (109).

9 Claims, 11 Drawing Sheets

Figure 1:
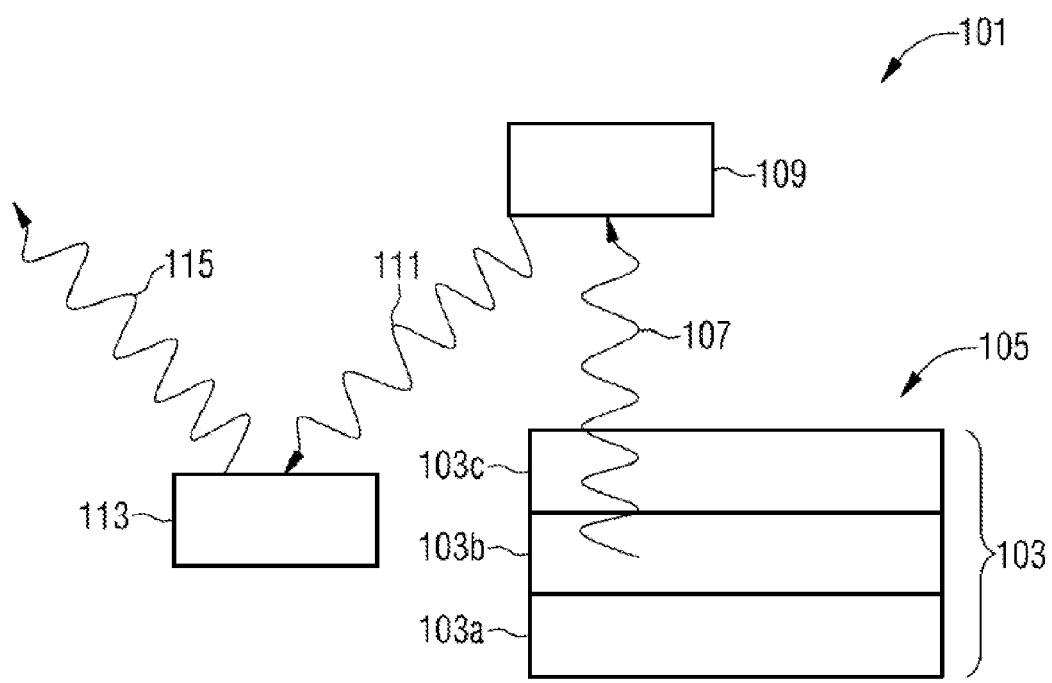

(51) Int. Cl.
*H01L 33/58* (2010.01)
*H01L 33/56* (2010.01)

(52) U.S. Cl.
CPC ........... *H01L33/504* (2013.01); *H01L 33/505* (2013.01); *H01L 33/56* (2013.01); *H01L 33/58* (2013.01); *H01L 2933/0091* (2013.01)

(56) References Cited

U.S. PATENT DOCUMENTS

2009/0268273 A1    10/2009  Powers et al.
2012/0153228 A1*   6/2012   Chen .................. C09K 11/7796
                                                    252/301.6 S
2014/0014984 A1*   1/2014   Gartner .............. H05B 33/0857
                                                    257/89
2014/0175478 A1*   6/2014   Wirth .................. G02B 5/0278
                                                    257/98

FOREIGN PATENT DOCUMENTS

| DE | 102010034915 A1 | 2/2012 | |
| EP | 2113949 A2 | 11/2009 | |
| WO | 2012/022628 A1 | 2/2012 | |
| WO | WO 2012101022 A1 * | 8/2012 | ......... H05B 33/0857 |

\* cited by examiner

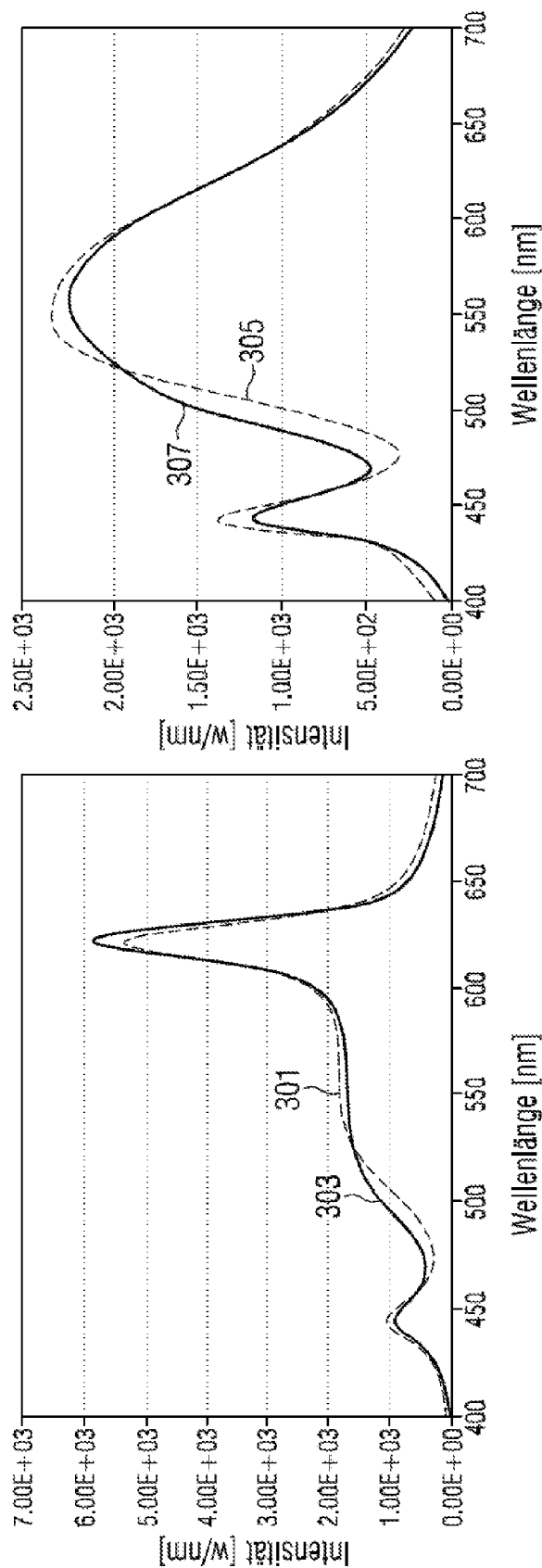

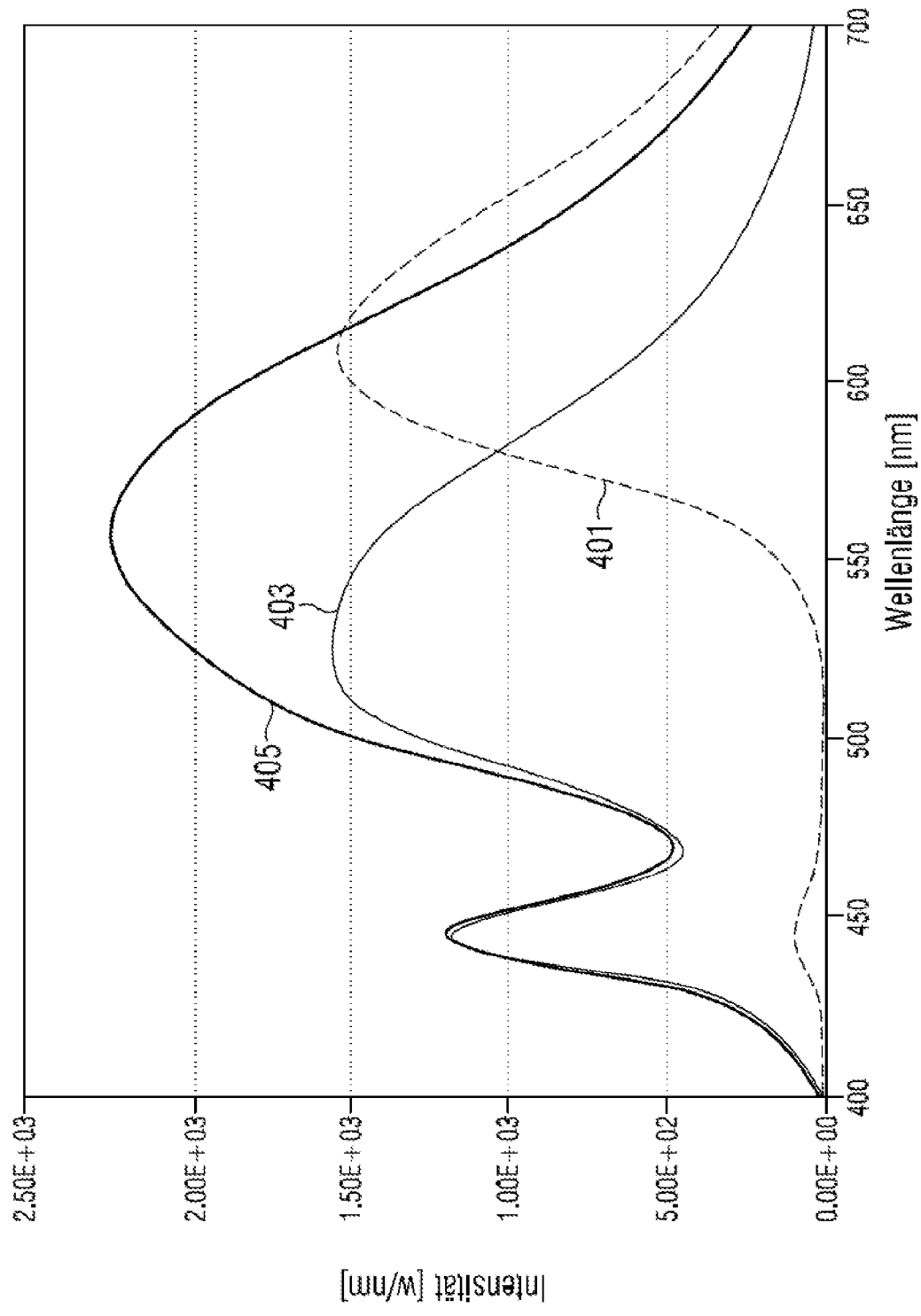

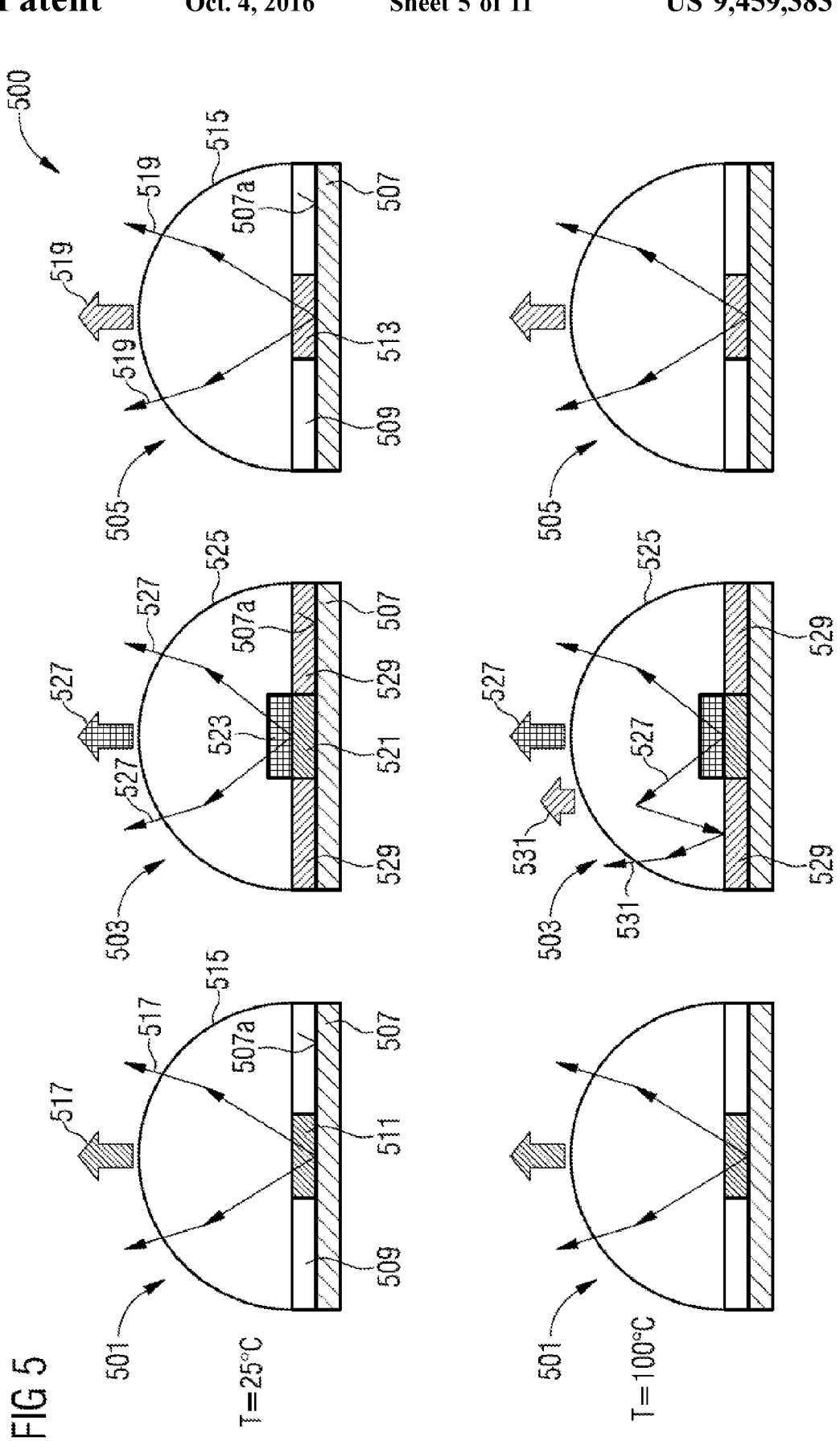

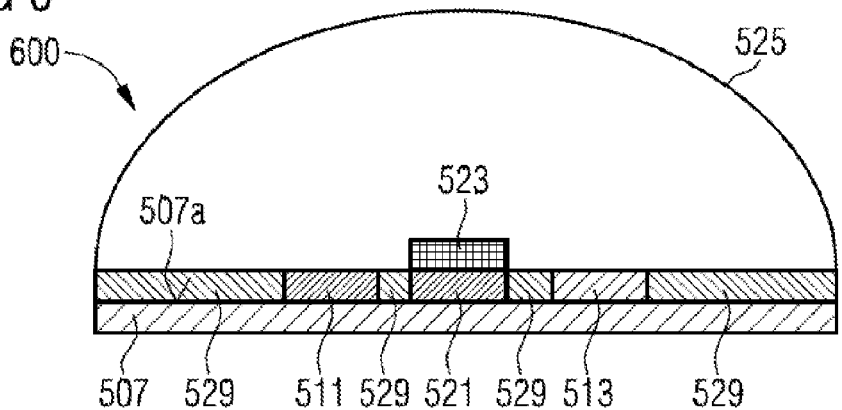
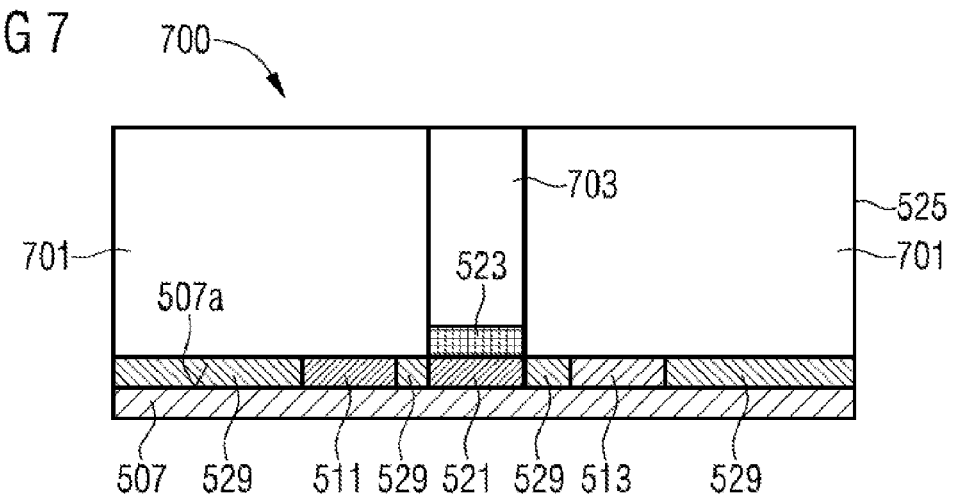
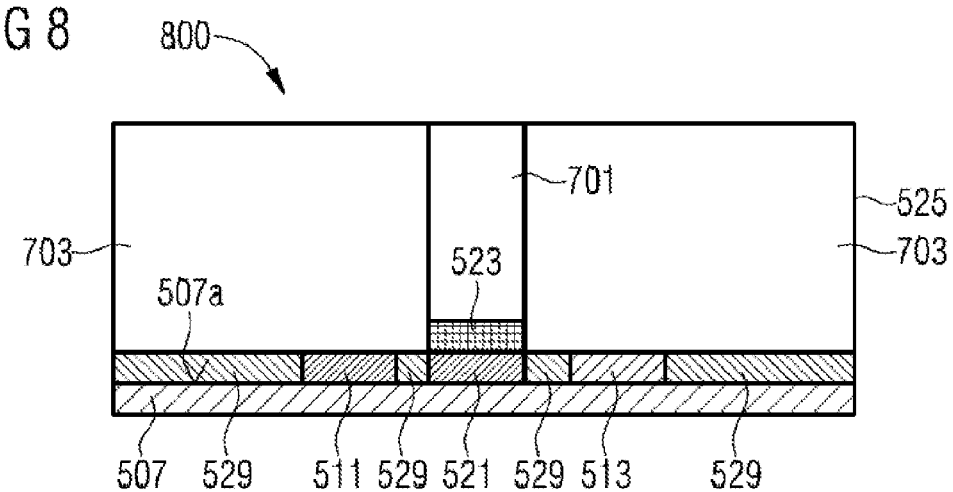

OPTOELECTRONIC DEVICE

The invention relates to an optoelectronic device.

From laid-open document WO 2012/022628 A1 an optoelectronic semiconductor component and a scattering body is known. The scattering body is designed to scatter light, wherein the light scattering decreases as temperature increases. At a temperature of 300 K, the scattering body is only partially permeable to a radiation. Only as the temperature increases does the scattering body become transparent.

The object of the invention can be considered that of provided an optoelectronic device.

The object of the invention can also be considered that of providing a scattering body.

These objects are achieved by the subject matter of the independent claims. Advantageous embodiments are the subject of dependent subordinate claims.

According to one aspect, an optoelectronic device is provided. The device comprises a semiconductor layer sequence which comprises an emitter layer for emitting electromagnetic radiation.

A converter is also provided which can convert electromagnetic radiation with a first wavelength, i.e. particularly electromagnetic radiation corresponding to a first optical spectrum, into an electromagnetic radiation with a second wavelength, i.e. particularly into an electromagnetic radiation corresponding to a second optical spectrum, wherein the second wavelength differs from the first wavelength.

Furthermore, the optoelectronic device comprises a scattering body for scattering at least a part of the electromagnetic radiation emitted by the emitter layer in the direction of the converter in order to convert at least a part of the emitted electromagnetic radiation.

The scattering body comprises a positive, temperature-dependent scattering cross-section and so, as the temperature increases, scattering of the electromagnetic radiation in the scattering body in the direction of the converter can be increased. That is to say in particular that as the temperature increases, the scattering of the electromagnetic radiation in the scattering body in the direction of the converter increases. That is to say in particular that at higher temperatures more electromagnetic radiation is scattered in the direction of the converter compared to at lower temperatures.

The scattering body can be adapted for interacting with incident electromagnetic radiation, i.e. for absorbing, transmitting and scattering incident electromagnetic radiation. The portion of the absorption $I_a$, and the portion of transmission $I_t$ and the portion of scattering $I_s$ thereby total 100%. $I_a+I_t+I_s=100\%$ is true. Depending on the properties of the scattering body $I_a$, $I_t$ and $I_s$ can be dependent on the temperature.

The fact that as the temperature increases, scattering of the electromagnetic radiation in the scattering body can be increased means particularly that the portion of scattering $I_s$ of the scattering body is greater at higher temperatures than the portion of scattering $I_s$ at lower temperatures, wherein the sum of $I_a$, $I_t$ and $I_s$ comes to 100% at the respective temperature.

That is to say particularly that the scattering body scatters a greater portion of the electromagnetic radiation at higher temperatures and therefore transmits and absorbs less compared with at lower temperatures.

"In the direction of the converter" means in this case and hereinunder that the scattered electromagnetic radiation is incident at least on a surface of the converter. In particular, this surface of the converter is arranged transverse to the main radiation direction of the electromagnetic radiation. The "main radiation direction" means in this case transverse to the growth direction of the semiconductor layer sequence.

According to a further aspect, a scattering body is provided for scattering electromagnetic radiation for an optoelectronic device, wherein the scattering body has a positive temperature-dependent scattering cross-section and so as the temperature increases, scattering of the electromagnetic radiation in the scattering body can be increased.

A positive temperature-dependent scattering cross-section means particularly that the scattering of the scattering body in the direction of the converter becomes greater as the temperature increases. In particular, the scattering body scatters more electromagnetic radiation at higher temperatures compared to at lower temperatures. In particular, an increase in temperature of at least 25° C., 30° C. or 40° C. and at most 100° C., 125° C. or 150° C. can take place. In particular, the temperature difference $\Delta T$ between the final and the starting temperature is at least 30 K, 40 K or 50 K and at most 75 K, 80 K, 100 K or 150 K.

In the case of optoelectronic devices it is generally the case that they become warmer during operation. That is to say a temperature of the device increases during operation. This generally leads to a spectral shift in the emitted electromagnetic radiation. For example, the spectrum can be red-shifted or blue-shifted. For example, as the temperature increases, an intensity distribution in the emitted electromagnetic radiation can change.

The effects mentioned above generally lead to a chromaticity coordinate shift.

By the provision of a scattering body comprising a positive temperature-dependent scattering cross-section, the above-mentioned effects, particularly the chromaticity coordinate shift, can advantageously be compensated for at least partially, and in particular entirely. This is the case because, as the temperature increases, the scattering body increasingly scatters the originally emitted electromagnetic radiation in the direction of the converter. That is to say particularly that as the temperature increases, the converter increasingly converts electromagnetic radiation and in this respect, re-radiates the correspondingly converted electromagnetic radiation. The converted electromagnetic radiation can then, for example, compensate for gaps or intensity variations in the spectrum of the electromagnetic radiation emitted by means of the emitter layer.

Provided that, for example, by reason of the increasing temperature, a red-shift of the spectrum of the originally emitted electromagnetic radiation has taken place, the converter can, for example, supplement the now lower blue or green portions in the spectrum and so a chromaticity coordinate is achieved in the overlap of the two spectra of the emitted radiation of the emitter layer and the emitted, converted radiation of the converter, this chromaticity coordinate essentially corresponding to the chromaticity coordinate at a temperature existing prior to the spectral shift of the spectrum, which is generally the case just after the device has gone into operation.

Furthermore, in an advantageous manner it is possible to achieve almost complete optical compensation of the chromaticity coordinate shift by a purely passive optical apparatus, in this case the scattering body. Therefore, in an advantageous manner, it is possible to dispense with additional electrical compensation. This considerably simplifies a structure. With corresponding optical quality of the scattering body, stabilisation of the emitted spectrum of the optoelectronic device can be effected with no effect on efficiency.

A scattering cross-section in terms of the present invention is particularly a measure of the probability that between an incident wave radiation, in this case the electromagnetic radiation, and the scattering body, scattering, i.e. an interaction between the electromagnetic radiation and the scattering body, will take place.

The fact that the scattering cross-section is a positive temperature-dependent scattering cross-section means particularly that the scattering cross-section increases as the temperature increases.

In one embodiment provision can be made that the scattering body for radiation emitted by the emitter layer is transparent at a temperature of 300 K. Only as the temperature increases will the scattering body become still only partially permeable or partially transparent, by reason of the increasing scattering cross-section, for the radiation emitted by the emitter layer or generally for electromagnetic radiation.

According to a further embodiment, provision can be made that the scattering body comprises a radiation-permeable matrix material with a first refraction index and scattering particles embedded therein and having a second refraction index, wherein a difference between the first and the second refraction index can be increased as the temperature increases. That is to say particularly, that the difference between the first and the second refraction index increases as the temperature increases. That is to say particularly that the difference in the refraction index between the matrix material and the scattering particles can be increased or does increase as the temperature increases. By reason of this property it is achieved in a particularly advantageous manner that the scattering body has a positive temperature-dependent scattering cross-section.

In another embodiment at a predetermined temperature, particularly 300 K, the scattering particles have approximately the same refraction index as the matrix material. In an advantageous manner this means that at this temperature there is no optical contrast between the scattering particles and the matrix material. In an advantageous manner this means that electromagnetic radiation can propagate unhindered through the scattering body and in this respect can be coupled-out.

In a further embodiment provision can be made that at a higher temperature the refraction number of the matrix material changes more than that of the scattering particles and so a difference between the individual refraction indices increases. Thus in an advantageous manner increased optical scattering takes place.

According to one embodiment the matrix material can be a silicone. The silicone can be, for example, a polysiloxane, a methylene-silicone, a phenylene-silicone or a silicone-epoxide hybrid material. The silicone can also preferably be a silicone from a respective subgroup of the above-mentioned silicone types. Preferably, in the case of a methylene-silicone the refraction index can be between 1.40 and 1.42. In the case of a phenylene-silicone a refraction index can be, for example, greater than 1.41. In particular a refraction index of a phenylene-silicone can be at most 1.56.

In particular, the phenylene-silicones can advantageously have increased thermal stability and increased chemical resistance.

In particular, the methylene-silicones have beneficial properties, for example, mechanical properties in relation to use in the health sector. Furthermore, the methylene-silicones can be used for encapsulation by reason of their good mechanical properties. That is to say also, for example, that a converter comprising a matrix material made from a methylene-silicone is particularly suitable for an encapsulation of the optoelectronic device. Therefore the device is advantageously particularly well protected against external influences.

According to a further embodiment provision can be made that the particle material, i.e. the material from which the scattering particles are formed, is glass, $BaF_2$, LiF or $MgF_2$. Preferably, different scattering particles can be embedded in the matrix material. For example, the particle material can be a silicon oxide, silicon dioxide or a metal fluoride.

According to a further embodiment provision can be made that a scattering particle size is between 200 μm and 10,000 μm, particularly between 200 μm and 1,000 μm. Preferably, the scattering particles each have the same size or a different size. The scattering particles can, for example, each be of a different form or of the same form. The scattering particles can be homogeneously or unhomogeneously dispersed in the scattering body.

According to another embodiment provision can be made that the scattering body is formed as a lens to refract the non-scattered electromagnetic radiation. In this way the scattering body can advantageously refract the non-scattered electromagnetic radiation and therefore change a radiation direction. For example, provision can be made that the scattering body is formed as a collecting lens for focussing the non-scattered electromagnetic radiation. Preferably, the scattering body, as a collecting lens, is of a convex or biconvex form. In the case of an appropriate geometric arrangement of the converter relative to the lens, this lens can also refract the converted electromagnetic radiation and, in the case of the collecting lens, can focus it.

According to a further embodiment provision can be made that the semiconductor layer sequence and the converter are arranged adjacent to one another on a common carrier substrate surface.

"Adjacent to one another" in terms of the present invention means particularly that the converter and the semiconductor layer sequence are arranged immediately adjacent to one another, i.e. without a space between the converter and the semiconductor layer sequence. "Adjacent to one another" particularly includes the case where the semiconductor layer sequence and the converter are arranged spaced apart from one another on the carrier substrate surface, i.e. not immediately adjacent.

In another embodiment provision can be made that the semiconductor layer sequence and the converter are each arranged adjacent to one another on a dedicated carrier substrate surface, i.e. are arranged particularly immediately or not immediately adjacent to one another.

According to a further embodiment provision can be made that the scattering body is arranged at least on one of the two respective surfaces of the semiconductor layer sequence and of the converter opposite the carrier substrate surface. That is to say particularly that the scattering body can be disposed on the surface of the semiconductor layer sequence, which is opposite the carrier substrate surface. The scattering body is preferably arranged on the surface of the converter, which is opposite the carrier substrate surface. In particular, the scattering body is arranged both on the surface of the semiconductor layer sequence, which is opposite the carrier substrate surface, and also on the surface of the converter, which is opposite the carrier substrate surface. The embodiments mentioned above and hereinunder are valid regardless of whether the semiconductor layer sequence and the converter are arranged on a common or on a respective dedicated carrier substrate surface.

The surface of the semiconductor layer sequence, which is opposite the carrier substrate surface, can particularly be designated as a semiconductor layer sequence surface. The surface of the converter, which is opposite the carrier substrate surface, can, for example, be designated as a converter surface.

By reason of the fact that the scattering body is arranged on the converter surface, it is advantageously achieved that a majority of the scattered radiation can also reach the converter, which considerably increases efficiency or effectiveness.

By reason of the fact that the scattering body is arranged on the semiconductor layer sequence surface, it is advantageously achieved that a majority of the radiation emitted by the emitter layer reaches the scattering body and so a majority of the emitted radiation is also scattered. This can advantageously increase effectiveness.

According to a further embodiment provision can be made that the scattering body is arranged as an encapsulation on the carrier substrate surface with the semiconductor layer sequence and the converter. That is to say particularly that the scattering body encapsulates the carrier substrate surface with the semiconductor layer sequence and the converter.

In another embodiment provision can be made that the scattering body is formed as a protective layer which is arranged on the respective surfaces of the individual elements.

Preferably, the encapsulation or the protective layer can be of a rectangular or semi-circular form.

By the provision of an encapsulation or of a protective layer the encapsulated or coated elements can advantageously be protected against external influences, for example, mechanical stresses or chemical influences. A service life of a corresponding optoelectronic device can therefore advantageously be increased.

According to a further embodiment provision can be made that the scattering body comprises a non-scattering region to emit a minimum intensity of a non-converted electromagnetic radiation. The region which scatters the radiation is particularly designated as a scattering region. A plurality of non-scattering regions can preferably be formed which can be formed, in particular, identically or preferably differently.

By the provision of a non-scattering region it is advantageously achieved that the scattering body does not scatter a certain portion of electromagnetic radiation which was generated by the emitter layer, but rather lets it pass through and so the optoelectronic device constantly radiates a minimum intensity of electromagnetic radiation. The non-scattering region is preferably formed from the matrix material, wherein the matrix material is then free of embedded scattering particles. Provision can preferably be made that the non-scattering region is formed from a matrix material different from the matrix material of the scattering region.

According to a further embodiment provision can be made that the non-scattering region is arranged on at least one of the two respective surfaces of the semiconductor layer sequence and of the converter. That is to say particularly that the non-scattering region is arranged on the semiconductor layer sequence surface and/or on the converter surface. The scattering region or regions are then preferably arranged on the corresponding free surfaces on which the non-scattering regions are not arranged.

A scattering region particularly designates a region in which scattering can take place. The scattering region thus particularly comprises a positive temperature-dependent scattering cross-section. The scattering region particularly comprises a matrix material with embedded scattering particles. In this respect, the non-scattering region particularly comprises only a matrix material without embedded scattering particles, i.e. it is free of scattering particles. A plurality of scattering regions are preferably formed which can in particular be identical or preferably different.

According to a further embodiment provision can be made that the emitter layer is formed as a converter layer for converting electromagnetic radiation with a third wavelength into electromagnetic radiation with a fourth wavelength different from the third wavelength and that the semiconductor layer sequence comprises an active zone for producing electromagnetic radiation which can be at least partially converted by the converter layer.

That is to say particularly that first a primary radiation is formed in the active zone of the semiconductor layer sequence, which, prior to a radiation from the optoelectronic device, is at least partially, in particular wholly, converted by the converter layer. For example, provision can be made that the active zone produces ultraviolet to blue light which is then converted in the converter layer at least partly, in particular wholly, into green light. A wavelength of the converted radiation can preferably be greater than a wavelength of the primary radiation.

Ultraviolet in terms of the present invention designates particularly a wavelength range between 230 nm and 400 nm. Preferably, an active zone, a converter layer, a converter and/or an emitter layer can then each comprise a diamond (C), aluminium nitride (AlN), aluminium gallium nitride (AlGaN), aluminium gallium indium nitride (AlGaInN) or a combination of the above-mentioned materials.

Violet in terms of the present invention designates particularly a wavelength range between 400 nm and 450 nm. Violet can particularly also designate only the wavelength of 450 nm. An active zone, a converter layer, a converter and/or an emitter layer can then preferably also each comprise indium gallium nitride (InGaN).

Blue in terms of the present invention designates particularly a wavelength range between 450 nm and 500 nm. An active zone, a converter layer, a converter and/or an emitter layer can then preferably each comprise zinc selenide (ZnSe), indium gallium nitride (InGaN), silicon carbide (SiC), zinc oxide (ZnO), silicon (Si) as a carrier or a combination of the above-mentioned materials.

Green in terms of the present invention designates particularly a wavelength range between 500 nm and 570 nm. An active zone, a converter layer, a converter and/or an emitter layer can then preferably each comprise InGaN, gallium nitride (GaN), gallium phosphide (GaP), aluminium-gallium-indium-phosphide (AlGaInP), aluminium-gallium-phosphide (AlGaP), zinc oxide (ZnO) or a combination of the above-mentioned materials.

Yellow in terms of the present invention designates particularly a wavelength range between 570 nm and 590 nm. An active zone, a converter layer, a converter and/or an emitter layer can then preferably each comprise gallium arsenide phosphide, aluminium-gallium-indium-phosphide (AlGaInP), gallium phosphide (GaP) or a combination of the above-mentioned materials.

Orange in terms of the present invention designates particularly a wavelength range between 590 nm and 610 nm. An active zone, a converter layer, a converter and/or an emitter layer can then preferably each comprise GaAsP, AlGaInP, GaP or a combination of the above-mentioned materials.

Red in terms of the present invention designates particularly a wavelength range between 610 nm and 760 nm. An active zone, a converter layer, a converter and/or a emitter layer can then preferably each comprise aluminium-gallium-arsenide (AlGaAs), gallium arsenide phosphide (GaAsP), aluminium-gallium-indium-phosphide (AlGaInP), gallium phosphide or a combination of the above-mentioned materials.

Infrared in terms of the present invention designates particularly a wavelength range greater than 760 nm. An active zone, a converter layer, a converter and/or an emitter layer can then preferably each comprise AlGaAs, GaAs or a combination of the above-mentioned materials.

Where a wavelength is generally mentioned previously or hereinunder, this wavelength can then be particularly in a wavelength range from ultraviolet to infrared.

According to a further embodiment provision can be made that the active zone is formed to produce electromagnetic radiation in a wavelength range from 230 nm to 500 nm, particularly from 400 nm to 500 nm, preferably 450 nm to 500 nm. The converter layer is preferably formed to convert at least some of the produced radiation into electromagnetic radiation in a wavelength range from 500 nm to 570 nm. The converter is preferably formed to convert the radiation converted by the converter layer into electromagnetic radiation with a wavelength of greater than 610 nm.

That is to say particularly, that in the active zone, particularly ultraviolet to blue light is first produced, which is converted into green light in the converter layer. The green radiation is then converted into red radiation in the converter. Therefore in an advantageous manner, a decrease in the red light in a luminous flux caused by an increasing temperature during operation of the optoelectronic device can advantageously be compensated for, this red light is emitted, for example, by an appropriately formed further device. A chromaticity coordinate shift into red can advantageously be compensated for.

In a further embodiment, a plurality of converters can be formed. The converters can preferably be the same or, in particular, different.

Figure 2:
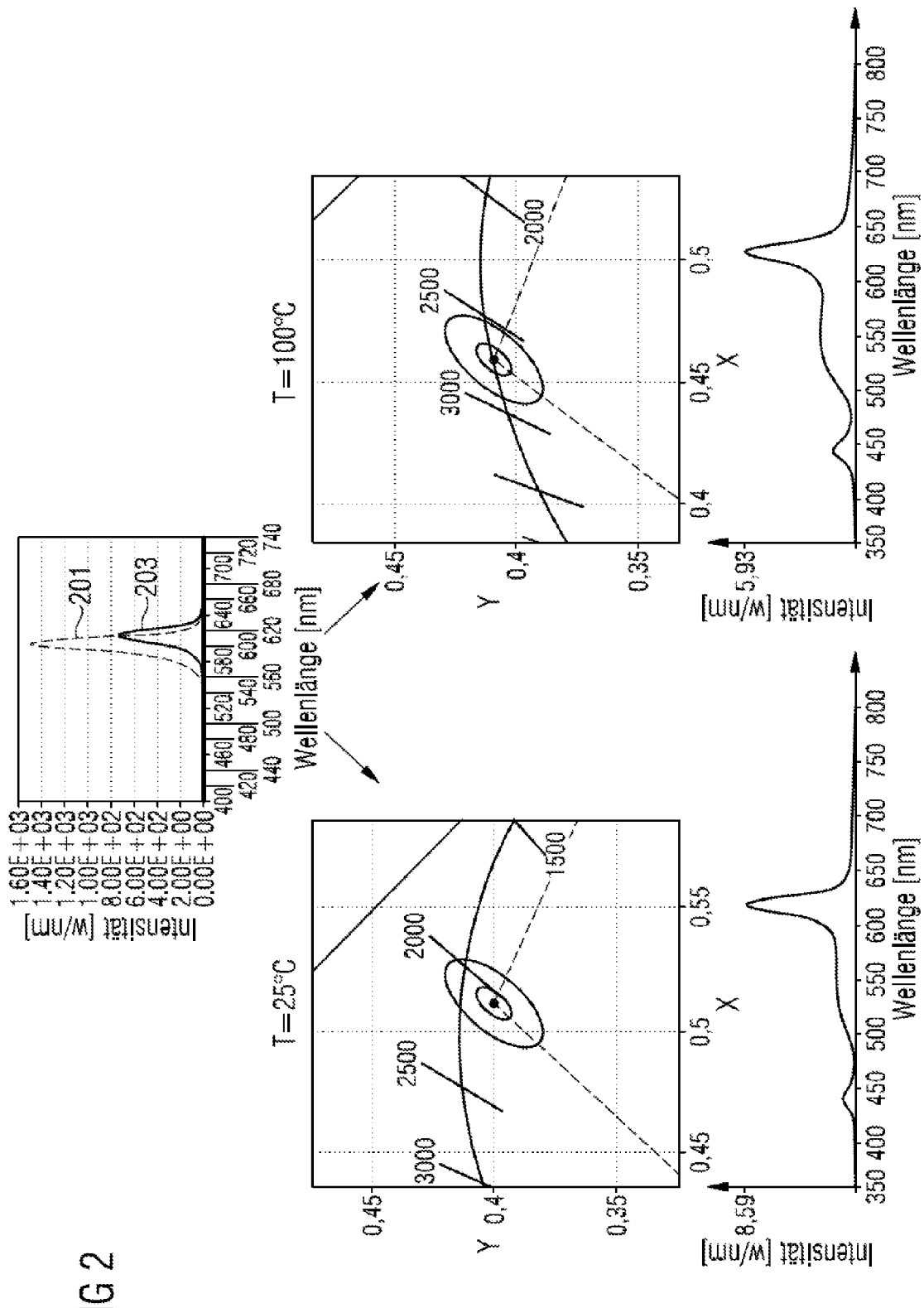
Figure 9:
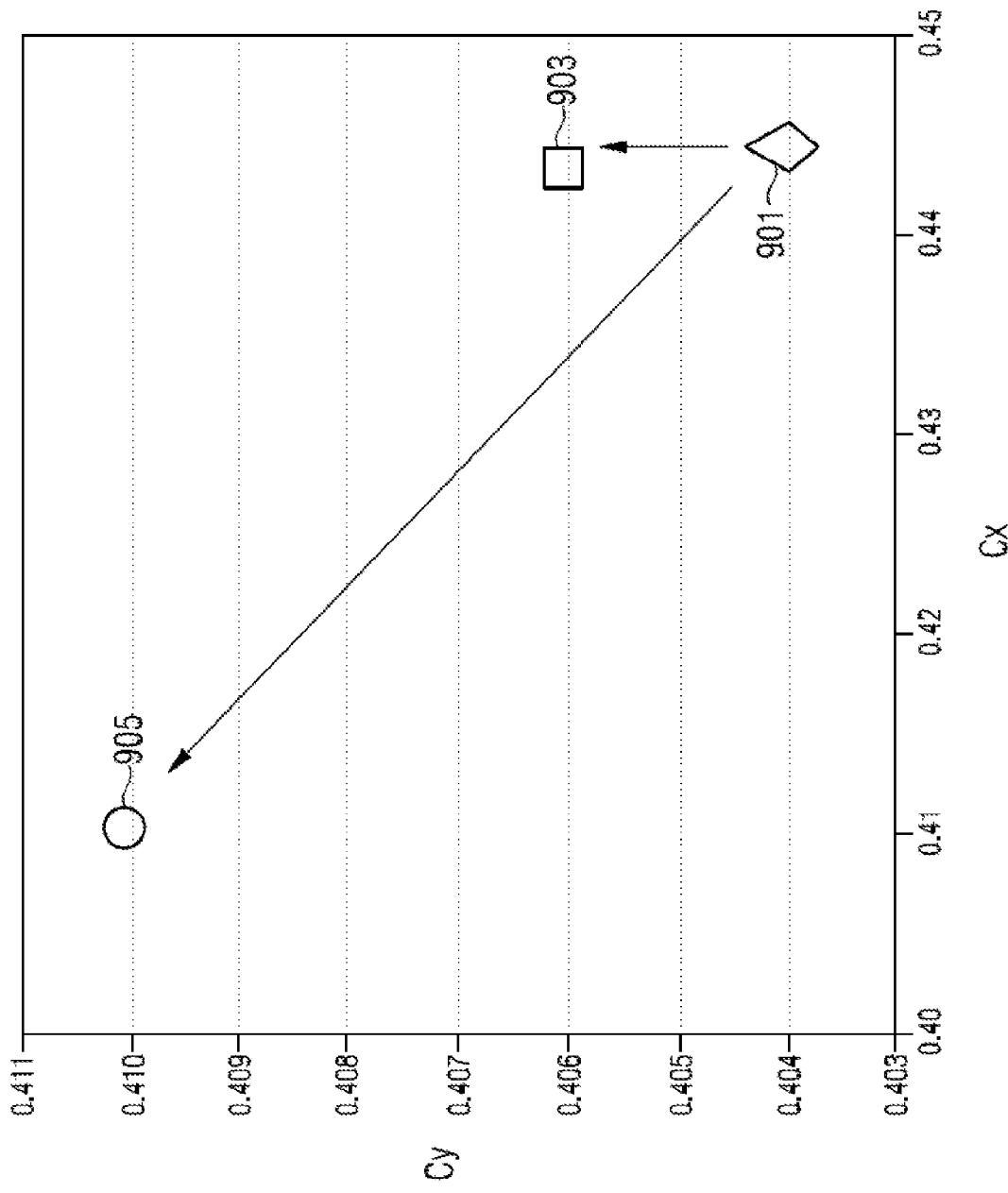
Figure 10:
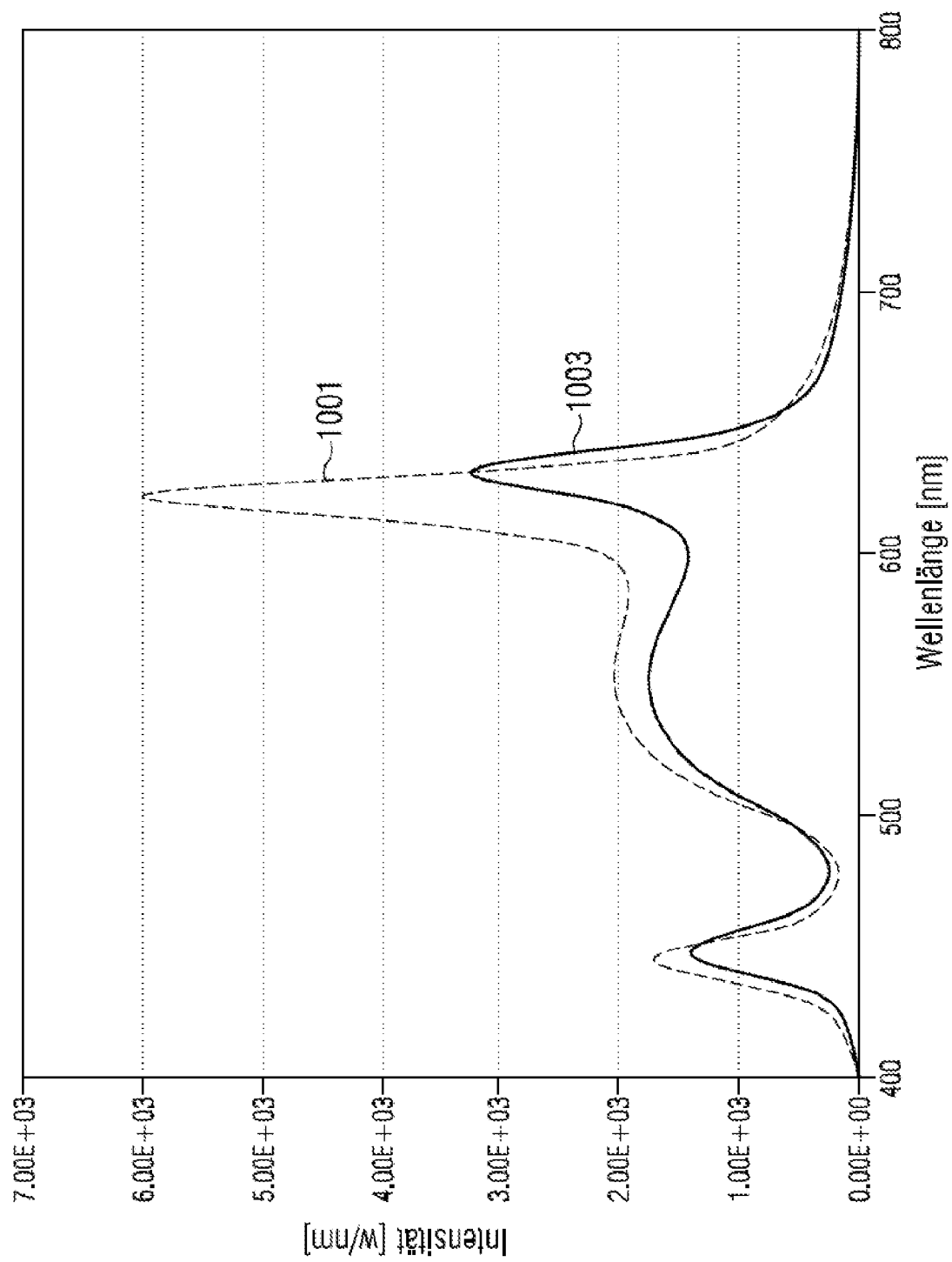
Figure 11:
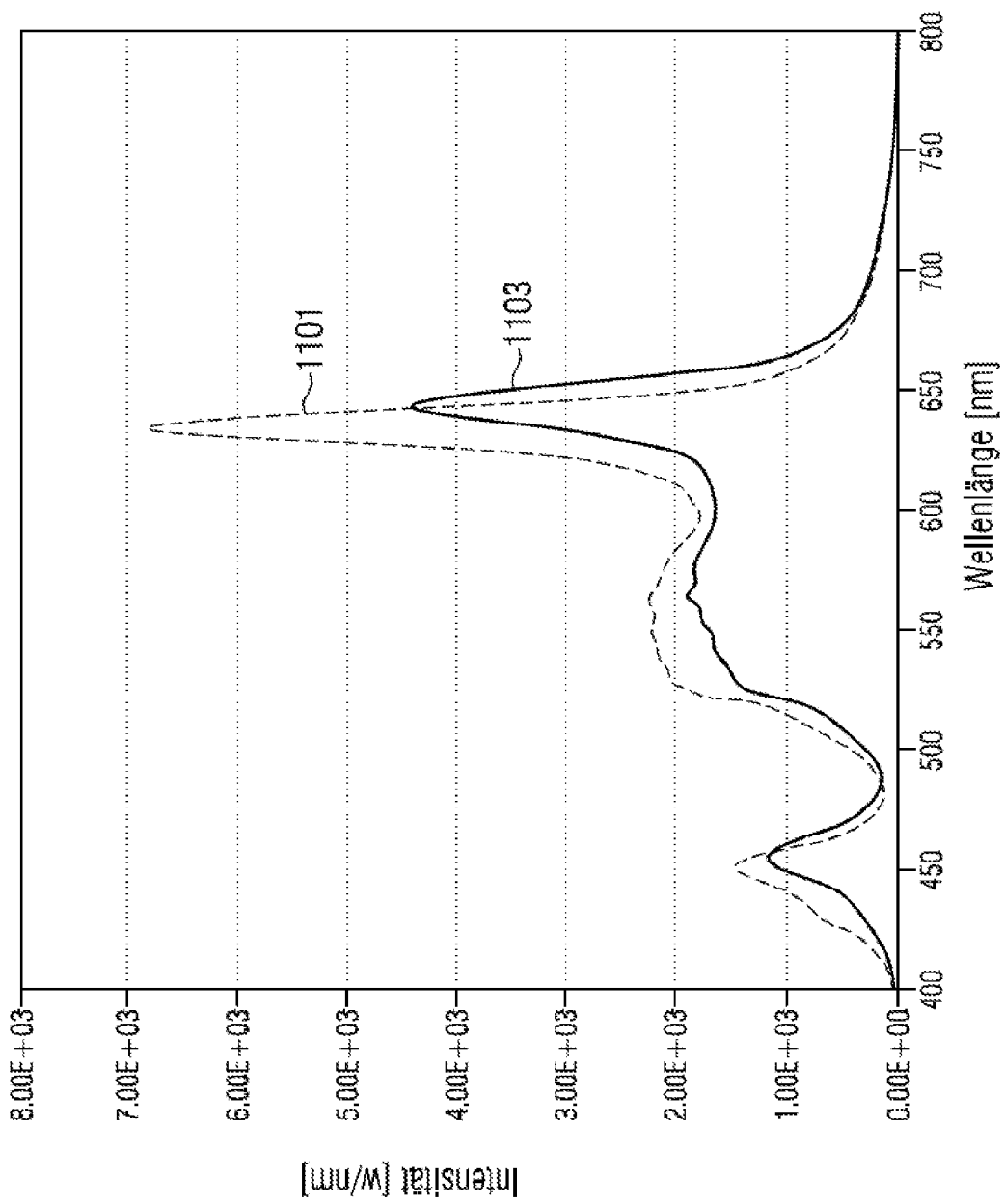
Figure 12:
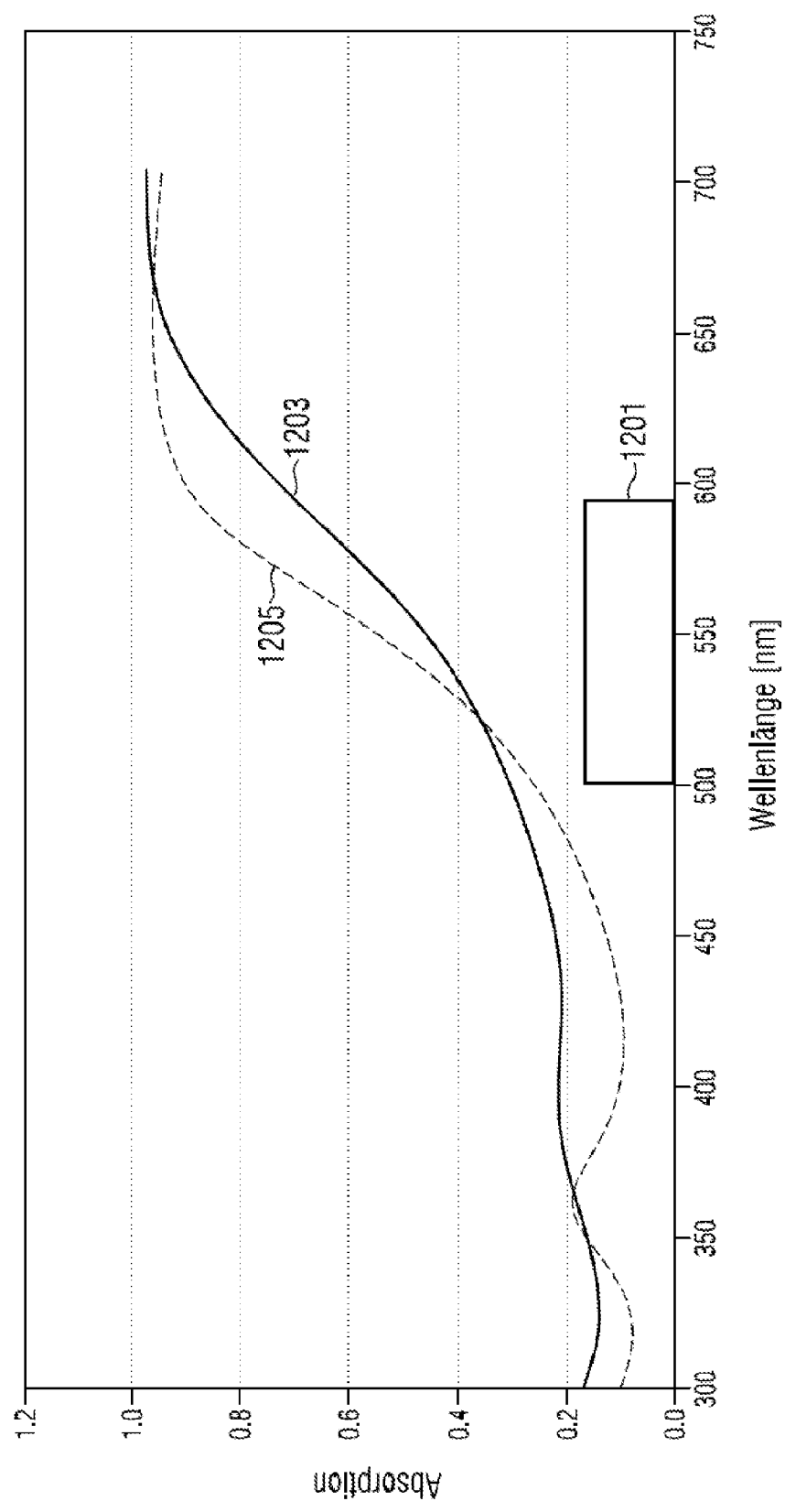
Figure 13:
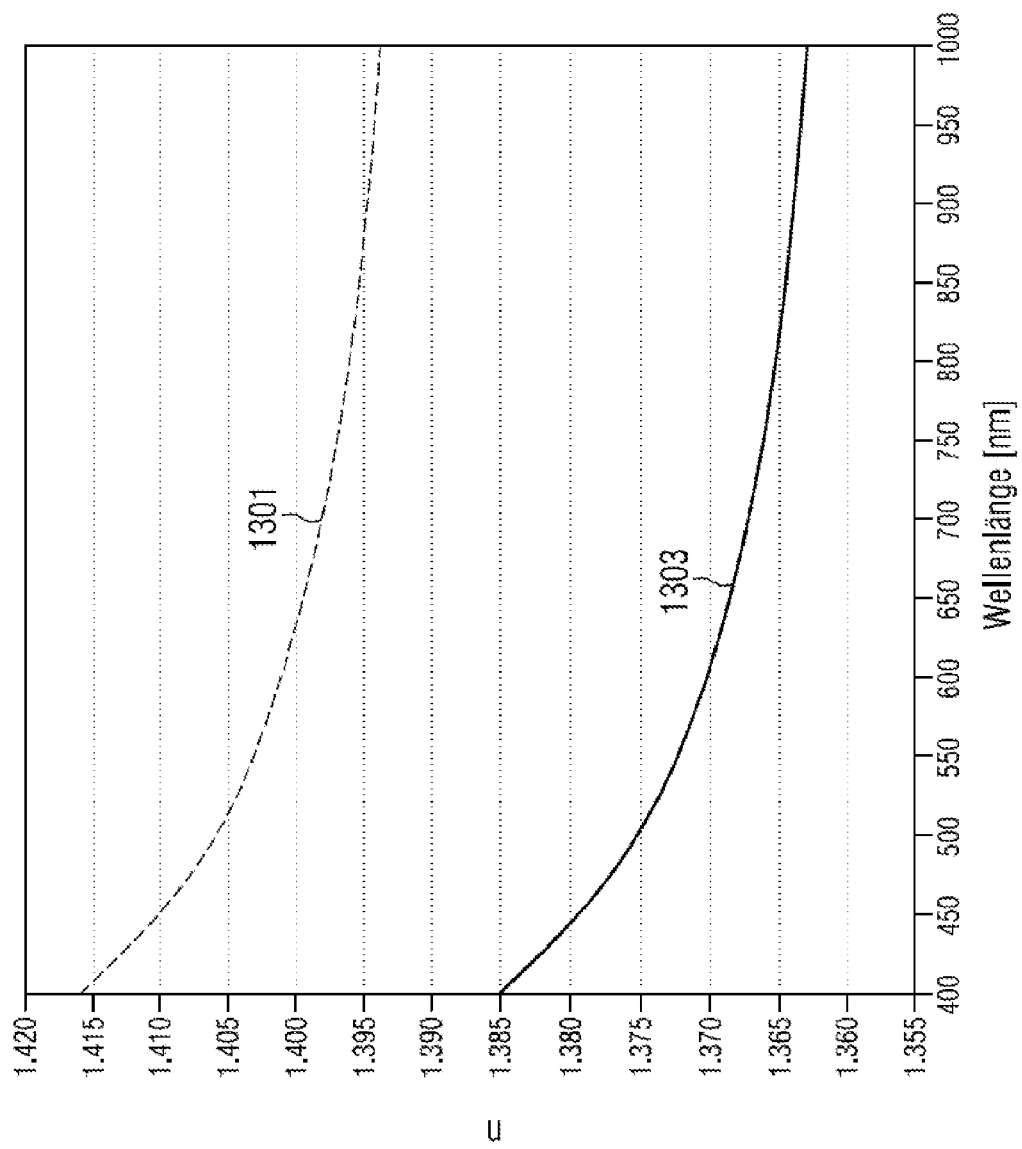

The above-described properties, features and advantages of this invention and the manner in which they are achieved will become more clearly and explicitly understandable in conjunction with the following description of the exemplified embodiments which are explained in more detail in conjunction with the drawings in which:

FIG. 1 shows an optoelectronic device;
FIG. 2 shows a chromaticity coordinate shift;
FIGS. 3 and 4 show spectra of different dyes which can be used for emitter layers, converters, converter layers and active zones, and corresponding overlaid spectra;
FIG. 5 shows an RGB system;
FIGS. 6 to 8 show further RGB systems;
FIG. 9 shows a comparison of two chromaticity coordinate shifts in a known optoelectronic device and in an optoelectronic device in accordance with the invention;
FIG. 10 shows a spectral shift in a known optoelectronic device;
FIG. 11 shows a spectral shift in an optoelectronic device in accordance with the invention;
FIG. 12 shows absorption curves of phosphors; and
FIG. 13 shows a graphical illustration of a dependency of the refraction index of silicone upon a wavelength.

Hereinunder like features can be designated by like reference numerals.

FIG. 1 shows an optoelectronic device 101.

The optoelectronic device 101 comprises a semiconductor layer sequence 103 comprising a plurality of layers 103a, 103b and 103c. The semiconductor layer 103b is formed between the two semiconductor layers 103a and 103c and is arranged directly adjacent to them. The semiconductor layer 103b is formed in the optoelectronic device 101 as an emitter layer 105. That is to say particularly that the emitter layer 105 is formed to emit electromagnetic radiation. In this case provision can preferably be made that the two semiconductor layers 103a and 103c are n-doped and p-doped semiconductor layers. The emitter layer 105 emits the electromagnetic radiation 107 as symbolically indicated in FIG. 1 by an arrow with the reference numeral 107.

The emitted electromagnetic radiation 107 at least partially reaches a scattering body 109. The scattering body 109 scatters at least some of the electromagnetic radiation 107, which is emitted by the emitter layer 105, in the direction of a converter 113. This scattered light is symbolically indicated in FIG. 1 by an arrow with the reference numeral 111.

The converter 113 converts the scattered electromagnetic radiation 111 into an electromagnetic radiation which at least partly has a wavelength range different from the scattered radiation 111. The converted electromagnetic radiation which is then radiated by the converter 113 is symbolically indicated in FIG. 1 with an arrow with the reference numeral 115.

In the optoelectronic device 101, the scattering body 109 has a positive temperature-dependent scattering cross-section and so, as the temperature increases, a scattering of the electromagnetic radiation in the scattering body 109 in the direction of the converter 113 increases.

That is to say particularly that while a temperature is increasing, the scattering in the scattering body 109 increases and so electromagnetic radiation is increasingly scattered in the direction of the converter 113. That is to say particularly that in the case of an increase in the temperature, a portion of the electromagnetic radiation 107 emitted by the emitter layer 105 is converted by the converter 113.

In this case provision is preferably made that the scattering body 109 at ambient temperature, particularly 300 K, is transparent for the emitted electromagnetic radiation 107 of the emitter layer 105. Only as the temperature increases, i.e., for example, during operation of the optoelectronic device 101, does the scattering cross-section in the scattering body 109 increase and so then light and/or electromagnetic radiation is then increasingly scattered in the direction of the converters 113.

In an embodiment which is not shown, provision can be made that the emitter layer 105 is formed as a converter layer and is preferably arranged as the last semiconductor layer on the top of the semiconductor layer sequence 103. Instead of the semiconductor layer 103b an active zone is then preferably provided which can also emit electromagnetic radiation. This emitted radiation, however, then radiates first into the converter layer and is converted therein. Only this converted light is then at least partly radiated in the direction of the scattering body 109.

For example, provision can be made that the active zone emits blue light, wherein then the converter layer is formed particularly to convert the blue light into green light. This green light is then particularly at least partly scattered by the scattering body 109 in the direction of the converter 113. Provision is then preferably made that the converter 113 is formed to convert the green light into red light. For example, for this purpose the converter 113 can comprise a phosphor compound.

In fact it is generally the case that optoelectronic devices such as, for example, light-emitting diodes, are normally operated at different temperatures. For example, at switch-on, an active zone or an emitter layer of the optoelectronic device is generally at ambient temperature, for example room temperature, for example 300 K. During a warm-up phase, the duration of which is dependent, for example, on the thermal resistances of the optoelectronic device and particularly dependent on a coupling to an optionally present heat sink which can be provided, a temperature of the active zone or of the emitter layer normally increases. This continues until normally a stable temperature is reached at a stationary operating point. This process normally takes place within a period of the first 10 to 30 minutes after switch-on. After the warm-up phase the temperature is generally particularly between ca. 75° C. and 125° C., wherein at the stationary operating point the temperature can also be, for example, above 150° C.

In the case of material systems used for optoelectronic devices, a light flux or a radiation flux typically changes particularly in dependence upon the temperature, particularly in the presence of a constant, temperature-independent current. Higher operating temperatures generally lead to a decrease in the light flux. For example, for semiconductor layer sequences based on InGaN a light flux at 100° C. is usually, for example, ca. 85% of the light flux at 25° C. In the case of semiconductor layer sequences based on InGaAlP this effect is generally somewhat more pronounced, particularly also since the emission wavelength is shifted out of a range of higher eye sensitivity. Thus in the case of a semiconductor layer sequence based on InGaAlP and emitting in the yellow spectral range, the brightness at 100° C. can decrease to ca. 40% of the value at 25° C. In the case of an emission in the red wavelength range, this decrease can be about 50% with respect to the brightness sensed by the human eye.

This temperature-dependency of the light flux can cause problems during use. For example, in the case of blinking lights or rear lights in automobiles a specific preset light flux is generally to be achieved. If the optoelectronic devices used, such as, for example, light-emitting diodes, are cold, i.e., for example, close to room temperature, they will generally shine too brightly. In the case of general illumination in workspaces, greenish-white-emitting optoelectronic devices with a plurality of semiconductor layer sequences are particularly used which emit particularly in the red, green, blue and/or yellow wavelength range and so the corresponding spectra can be combined with one another. In the case of such a combination of differently emitting semiconductor layer sequences and the comparatively strong decrease in the light flux—which accompanies the increasing temperature—of the red-emitting semiconductor layer sequence and possibly the yellow-emitting semiconductor layer sequence, strong colour changes can occur, i.e. a shift in the chromaticity coordinate.

For example, the correlated colour temperature changes by about 600 K from ca. 2400 K at room temperature to 3000 K at the stationary operating point of the optoelectronic device at ca. 100° C. Thus after switch-on, red-tinged light is emitted before, after ca. 10 minutes to 30 minutes, the desired light colour is achieved. Furthermore, such temperature-dependent colour changes which extend over relatively long time periods, can cause problems in the case of back-lighting, for example, for liquid crystal displays.

The explanations above relating to a chromaticity coordinate shift in the case of red-emitting semiconductor layer sequences are caused particularly by a strong decrease in the quantum efficiency in the case of InGaAlP.

The chromaticity coordinate shift can, for example, be compensated for by a suitable electrical control. However, this generally requires additional effort in driver design and therefore leads to high additional costs for the system depending on the precision of the compensation.

FIG. 2 graphically illustrates the above-described chromaticity coordinate shift by light flux decrease in a red light-emitting semiconductor layer sequence. The two lower graphs show the emitted spectrum of a system comprising a red-, blue- and green-emitting semiconductor layer sequence with respective corresponding emitter layers and possibly active zones with an associated converter layer. The left-hand graph shows the situation at a temperature of 25° C. The right-hand graph shows the situation at a temperature of 100° C. The intensity in Watts per nanometer is plotted over the wavelength in nanometers. Above the spectrum the colour space is illustrated, wherein this is particularly the RGB (red, green, blue) colour space. Above these two spectra a further spectrum is shown. In this case also, the intensity in Watts per nanometer is plotted over the wavelength in nanometers. The curve with the reference numeral 201 depicts the case of a temperature of 25° C. The curve with the reference numeral 203 shows the case at a temperature of 100° C. Both spectra correspond to the red light of the red light-emitting semiconductor layer sequence.

A strong chromaticity coordinate shift at T=100° C. is clear to see.

FIGS. 3 and 4 each show different spectra of different dyes, as can be used for emitter layers, active zones, converters and converter layers. Also shown are corresponding overlaid spectra which result from the overlaying of the individual spectra.

The intensity is plotted in Watts per nanometer over the wavelength in nanometers.

The respective curve with the reference numerals 305 and 401 depicts a spectrum of a YaG dye.

The respective curve with the reference numerals 307 and 405 depicts a spectrum for a green dye based on LuAG mixed with the spectrum 305 or 401.

The curve with the reference numeral 403 depicts a spectrum of a green dye based on LuAG.

The curve with the reference numeral 301 depicts a spectrum of a green-yellow dye based on YaG mixed with a spectrum of a principally orange—(for example, at a maximum at 606 nm) or red-emitting dye.

The curve with the reference numeral 303 depicts a spectrum mixed from the spectrum 307 with a spectrum of the principally orange—(for example, at a maximum at 606 nm) or red-emitting dye.

For the spectrum shown on the left in FIG. 3 it is particularly the case that a temperature at the p-n-transition is 100° C. and a colour reproduction index is 91 and a luminous efficacy of radiation (LER) is =45-350 lm/W.

FIG. 5 shows an RGB system 500.

RGB in this case stands for red, green and blue. Such a system conventionally comprises an optoelectronic device emitting red electromagnetic radiation, blue electromagnetic radiation and green electromagnetic radiation and so where there is an overlay of red, blue and green, a specific chromaticity coordinate or a specific colour temperature, for example, white light, is produced.

The RGB system 500 comprises three optoelectronic devices 501, 503 and 505. Each of the three optoelectronic devices 501, 503 and 505 has a carrier substrate 507.

The three optoelectronic devices are preferably also each disclosed in their own right. Thus in particular the optoelectronic device 503 is disclosed in its own right without the two other devices 501 and 505.

The devices 501, 503, 505 are each shown twice one above another in two rows. The upper row describes the case where the temperature is 25° C. The lower row describes the case where the temperature is 90° C.

On a carrier substrate surface 507a of the optoelectronic device 501 and of the optoelectronic device 505 in each case a $TiO_2$ silicone layer 509 is applied. In the device 501 the $TiO_2$ silicone layer 509 has a blue light-emitting active zone 511. In the optoelectronic device 505 the $TiO_2$ silicone layer 509 comprises a red light-emitting active zone 513. A lens 515 comprising a convex shape is provided in each case on the $TiO_2$ silicone layer 509 of the two devices 501 and 505. The lens 515 preferably comprises a silicone as its material.

During operation of the two devices 501 and 505 the device 501 thus emits blue light. The device 505 emits red light. By reason of an increasing temperature, however, there will normally be a decrease in light flux in the device 505 which emits red light.

Emission of red light is symbolically shown by arrows designated with the reference numeral 519. The reference numeral 517 designates arrows with respect to the device 501, which are intended to show the emission of blue light.

The optoelectronic device 503 has a blue light-emitting active zone 521 on the carrier substrate surface 507a, on which zone a converter layer 523 is applied which can convert the blue light of the active zone 521 into green light. The green light then emitted is in this case designated by arrows designated by the reference numeral 527. The converter layer 523 can preferably comprise an LuAG-ceramic converter material.

Also disposed on the carrier substrate surface 507a are two converters 529 which are disposed left and right of the active zone 521 and adjacent thereto. In this case the two converters 529 comprise a phosphor compound which ensures that the converters 529 can convert the green light 527 into red light when the green light 527 reaches them.

A scattering body 525 is disposed on the converters 529 and on the converter layer 523 and in this case is preferably formed as a collecting lens comprising a convex shape. In a form which is not shown, other shapes for the scattering body are possible. That is to say particularly that the embodiment described in FIG. 5 should not be limited to collecting lenses comprising a convex shape.

The collecting lens 525 comprises a positive temperature-dependent scattering cross-section and so, as the temperature increases, the scattering body 525, i.e. in this case the collecting lens, can scatter light.

During operation of the of the optoelectronic device 503 this has the advantageous effect that the green light 527 is strongly scattered, preferably in the direction of the converters 529. As the temperature increases, these thus increasingly convert the green light 527 into red light, which is then radiated from the converters 529. The converted light is in this case depicted with arrows with the reference numeral 531. This is illustrated by way of example in this case at a temperature of 90° C.

Since the green light 527 is generally not wholly scattered, some of the green light continues to be radiated outwards by the collecting lens 525. Red light 531 is radiated at the same time.

This converted red light 531 compensates for the loss of red light 519 which the optoelectronic device 505 comprises.

That is to say particularly that a return of the emission from the optoelectronic device 505, which directly radiates red light, can be compensated for by an additional emission of the green-red converted light 531 from the optoelectronic device 503.

That is to say particularly that a simple optical compensation of the chromaticity coordinate drift or the chromaticity coordinate shift can be achieved in that via a temperature-activated scattering, namely by the scattering body 525, the green light 527 is converted into red light 531 at least partly or more strongly as the temperature increases. In this way the loss of red light by thermal quenching processes in the device 505 is advantageously compensated for by means of a change in the red-green ratio, whereby in the radiated full spectrum of the RGB system 500, the chromaticity coordinate can be stabilised.

Thus an almost complete optical compensation of the chromaticity coordinate shift is thereby effected by a purely passive optical apparatus, in this case the scattering body with the positive temperature-dependent scattering cross-section and so advantageously no additional electric compensation is required. This simplifies the RGB system 500 considerably. In the case where the individual components are of suitable optical quality a stabilisation can be carried out with no effect on efficiency.

The scattering body 525 preferably comprises as a matrix material a silicone, in which scattering particles, for example, $SiO_2$, are embedded. In this case at room temperature, particularly at 300 K, the scattering particles comprise approximately the same refraction index as the matrix material, in this case, for example, silicone. This advantageously means that at this temperature, i.e. room temperature, particularly 300 K, no optical contrast between the scattering particles and the matrix material is provided. This advantageously means that electromagnetic radiation can propagate unhindered through the scattering body 525 and in this respect can be coupled out.

At a higher temperature the refraction number of the matrix material changes more strongly than that of the scattering particles and so a difference between the individual refraction indices increases. Stronger optical scattering thereby advantageously occurs. This scattering then advantageously leads to the green photons being scattered onto the converter 529 disposed next to the active blue zone 521, which converter can particularly be formed as a red phosphor layer and so these photons can then be converted into red photons. This advantageously leads to a shift of the spectrum of the originally green-emitting device 503 towards red, whereby the strong return of the emission of the device 505 can be compensated for.

FIGS. 6, 7 and 8 each show a further embodiment of an RGB system 600 or 700 or 800.

The RGB system 600 as shown in FIG. 6 comprises a carrier substrate 507. Different semiconductor layers or semiconductor layer sequences are applied to the carrier substrate surface 507a as follows:

From left to right as seen relative to a top view a converter 529 is first applied, wherein on the right next to the converter 529 the active blue zone 511 is applied. On the right next to the active blue zone 511 a further converter 529 is applied. On the right, adjacent to the converter 529 a further blue active zone 521 is disposed. Adjacent to this active zone 521 a further converter 529 is applied to the carrier substrate surface 507a. Adjacent to this converter 529 a red active zone 513 is applied. Adjacent to this red active zone 513 a further converter 529 is applied to the substrate surface 507*a*.

That is to say particularly that the three optoelectronic devices 501, 503, 505 according to the system 500 as shown in FIG. 5, which in that location were still provided as individual devices with a dedicated carrier substrate, are now formed as shown in FIG. 6 on a common carrier substrate, in this case carrier substrate 507. Analogously to the device 503, in this case the blue active zone 521 also comprises a converter layer 523 which is disposed on the active zone 521.

The system 600 thus emits both blue and also red and also green light, in as far as the blue light of the zone 521 is converted into green light by means of the converter layer 523.

Furthermore, analogously to the devices 501, 503, 505, a collecting lens 525 is applied as a scattering body to the elements disposed on the carrier substrate 507, wherein in contrast to FIG. 5, the collecting lens 525 is provided as a common collecting lens for the individual light-emitting elements.

The scattering body 525 is formed analogously to the scattering body 525 as shown in FIG. 5. Statements made in conjunction with the system 500 of FIG. 5 with respect to the temperature-dependent scattering apply analogously to the RGB system 600 as shown in FIG. 6.

In this case provision can preferably be made that the active zone 513 comprises InGaAlP. The active zone 521 and the active zone 511 can preferably comprise InGaN. The converters 529 preferably comprise a phosphor compound.

FIG. 7 shows a further RGB system 700 which is constructed substantially analogously to the RGB system 600 as shown in FIG. 6. Reference may be made to the corresponding statements.

As a difference thereto the scattering body 525 in FIG. 7 comprises two non-scattering regions 701 and one scattering region 703. That is to say particularly that the region 703 comprises a positive temperature-dependent scattering cross-section. The two non-scattering regions 701, in contrast, are transparent for the emitted electromagnetic radiation. In this case the scattering region 703 is formed above the converter layer 523. The region 703 is rectangular as seen in cross-section and has a width equal to the width of the converter layer 523. To the left and right next to the scattering region 703 the two non-scattering regions 701 are disposed.

In this case provision can be made that the scattering region 703 comprises both a matrix material, for example silicone, and scattering particles, for example silicon dioxide.

The non-scattering regions 701 preferably comprise merely a matrix material, for example, silicone, and are in this respect free of scattering particles. They are thus in particular free of scattering particles. In particular, the matrix material of the scattering region and the matrix material of the non-scattering region can be formed from the same material, for example, dialkyl polysiloxane. In particular, the matrix materials of the scattering and non-scattering regions both have the same chemical composition.

Thus when, in operation of the RGB system 700, a temperature increases, only the scattering region 703 will at least partly scatter back the green light emitted by the converter layer 523 in the direction of the converter 529. Light which is emitted by the converter layer 523 in the direction of the non-scattering regions 701 is not scattered in the direction of the converter 529. Rather, the light penetrates the non-scattering regions 701 and is then correspondingly coupled out of the scattering body 525.

Therefore there is advantageously always a minimum potion of green-converted electromagnetic radiation available since a certain part is always non-scattered and in this respect can be coupled out in an unhindered manner.

FIG. 8 shows a further RGB system 800.

The RGB system 800 is constructed substantially analogously to the RGB system 700 as shown in FIG. 7. Reference can be made to the corresponding statements.

In contrast thereto, in this case the non-scattering regions and the scattering regions are exchanged in the geometrical arrangement.

That is to say particularly that the scattering region 703 extends or is disposed on the left and right of the non-scattering region 701. That is to say particularly that the non-scattering region 701 extends above the converter layer 523.

FIG. 9 shows a comparison between a chromaticity coordinate shift in a known optoelectronic device and an optoelectronic device in accordance with the invention.

The coordinates Cy and Cx of the RGB colour space are plotted. The reference numeral 901 designates the position which the chromaticity coordinate of the respective optoelectronic device comprises at a temperature of 25° C. The reference numeral 903 designates the position which the chromaticity coordinate of the optoelectronic device in accordance with the invention comprises at a temperature of 90° C. That is to say particularly that this optoelectronic device comprises a scattering body with a positive temperature-dependent scattering cross-section and a correspondingly disposed converter.

The reference numeral 905 designates the position of a chromaticity coordinate at a temperature of 90° C. in an optoelectronic device according to the prior art, in which no compensation of the chromaticity coordinate shift has taken place.

FIG. 10 shows a spectral shift.

The intensity in Watts per nanometer is plotted over the wavelength in nanometers.

The reference numeral 1001 designates the spectrum of a red light-emitting semiconductor layer sequence at a temperature of 25° C. The reference numeral 1003 designates the corresponding spectrum at a temperature of 90° C. By reason of the increased temperature it is clear to see the shift of the spectrum, which leads to a corresponding chromaticity coordinate shift.

FIG. 11 shows a spectral shift in an optoelectronic device in accordance with the invention.

The intensity in Watts per nanometer is plotted over the wavelength in nanometers.

The reference numeral 1101 designates the spectrum of the red light-emitting semiconductor layer sequence at a temperature of 25° C. The reference numeral 1103 designates the corresponding spectrum at a temperature of 90° C. The reason for the greater shift towards red in some wavelength ranges compared to the spectral shift shown in FIG. 10 is particularly that in this case an increased phosphor concentration is provided in the converter.

FIG. 12 shows absorption curves of different red phosphors.

The absorption in random units is plotted over a wavelength in nanometers.

The region designated by the reference numeral 1201 shows the wavelength range in which the LuAG preferentially absorbs photons. This is in this case particularly a green wavelength range.

The reference numerals 1203 and 1205 designate corresponding absorption curves for 2 possible phosphor compounds.

Such phosphor compounds can, for example, comprise Eu-doped CaAlSiN.

FIG. 13 shows a dependency of a refraction index of a silicone over a wavelength.

The refraction index n is plotted over the wavelength in nanometers.

The reference numeral 1301 designates the course at a temperature of 25° C.

The reference numeral 1303 designates the course at a temperature of 120° C.

In this case, for silicone $dn/dT \approx 3.2e-4$.

A change to the refraction index in dependence upon the temperature for $SiO_2$ is about $dn/dT \approx 5e-6$.

There follows an exemplified calculation for the change to the corresponding refraction index at a temperature of 25° C. and 125° C.

n in this case designates the refraction index.

At a temperature of 25° C., a refraction index of silicon dioxide is 1.4600. The refraction index of silicone at a temperature of 25° C. is 1.410.

That is to say particularly that a difference in the refraction index is 0.05.

At a temperature of 125° C. a refraction index of silicon dioxide is 1.4595. A refraction index of silicone at a temperature of 125° C. is 1.377.

That is to say particularly that a difference in refraction index at a temperature of 125° C. is 0.0825.

That is to say particularly that as the temperature increases, the difference in the refraction index increases. This means particularly that the scattering increases correspondingly.

Polysiloxane or subgroups can preferably be provided as silicone. For example, methylene side groups can be provided, particularly phenylene side groups can be provided.

In an embodiment which is not illustrated, provision can be made that the converter layer 523 which converts red light into green light, has a thickness of between 50 μm and 400 μm.

A thickness of the converter 529 which converts the green light into red light is particularly between 100 μm and 500 μm.

Preferably a weight concentration of phosphor or of a phosphor compound in the converter 529 can be between 5 wt. % (percent by weight) and 80 wt. %.

$SiO_2$ can be provided, for example, as the matrix particles. A particle size can be between 200 μm and 10,000 μm.

The scattering particles, in this case, for example, the silicon dioxide, can, for example, be formed as ground glass, particularly ground glass with a correspondingly adapted refraction index. That is to say that glass can be ground in order to produce the scattering particles.

In summary, therefore, the invention particularly comprises the idea of providing a scattering body with a positive temperature-dependent scattering cross-section, which, at an increasing temperature, increasingly scatters electromagnetic radiation in the direction of a converter and so the scattered light can then be converted by the converter.

In corresponding RGB systems therefore, for example, a chromaticity coordinate shift can advantageously be compensated for. This requires in particular no complex electrical control for a compensation of a chromaticity coordinate shift, which leads to lower costs and less complexity in production.

Although the invention was described and illustrated in detail using the preferred exemplified embodiments, the invention is not limited by the examples disclosed and other variations may be derived therefrom by the person skilled in the art without departing from the scope of protection of the invention.

This patent application claims the priority of German patent application 10 2012 217643.8, the disclosure content of which is hereby incorporated by reference.

The invention claimed is:

1. An optoelectronic device, comprising:
a semiconductor layer sequence with an active zone comprising an emitter layer for emitting electromagnetic radiation;
a first converter for converting electromagnetic radiation with a first wavelength into an electromagnetic radiation with a second wavelength which differs from the first wavelength, wherein the second wavelength is selected from the wavelength range of green light;
two second converters for converting electromagnetic radiation of the first converter into red light, wherein the two second converters are respectively disposed left and right of the active zone in side view and are adjacent to the active zone; and
a scattering body, which is disposed on the first converter and the two second converters, for scattering at least a part of the electromagnetic radiation emitted by the first converter, wherein the scattering body comprises a positive, temperature-dependent scattering cross-section and so, as the temperature increases, scattering of the electromagnetic radiation in the scattering body in the direction of the two second converters can be increased and thus the conversion of the green light emitted by the first converter into red light emitted by the two second converters can be increased, and wherein the device emits red light as well as green light.

2. The optoelectronic device according to claim 1, wherein the scattering body comprises at least one scattering region and a plurality of non-scattering regions, wherein the scattering region has a positive, temperature-dependent scattering cross-section, wherein the non-scattering regions are transparent for the emitted electromagnetic radiation, wherein the scattering region is formed above the first converter.

3. The optoelectronic device according to claim 1, wherein the scattering body comprises a radiation-permeable matrix material with a first refraction index and scattering particles embedded therein and having a second refraction index, and wherein a difference between the first and the second refraction index can be increased as the temperature increases.

4. The optoelectronic device according to claim 3, wherein a scattering particle size is between 200 μm and 10,000 μm.

5. The optoelectronic device according to claim 1, wherein the scattering body is formed as a collecting lens for focussing the non-scattered electromagnetic radiation.

6. The optoelectronic device according to claim 1, wherein the semiconductor layer sequence and the first converter are arranged adjacent to one another on a carrier substrate surface, and wherein the scattering body is arranged at least on one of the two respective surfaces of the semiconductor layer sequence and of the first converter opposite the carrier substrate surface.

7. The optoelectronic device according to claim 1, wherein the scattering body comprises a non-scattering region to emit a minimum intensity of a non-converted electromagnetic radiation.

8. The optoelectronic device according to claim 7, wherein the non-scattering region is arranged on at least one of the two respective surfaces of the semiconductor layer sequence and of the first converter.

9. The optoelectronic device according to claim 1, wherein the matrix material comprises a silicone selected from the following group of silicones: polysiloxane, methylene-silicone and phenylene-silicone.

* * * * *